(12) United States Patent
Yui et al.

(10) Patent No.: US 8,993,416 B2
(45) Date of Patent: Mar. 31, 2015

(54) METHOD OF MANUFACTURING SEMICONDUCTOR DEVICE

(75) Inventors: Keiichi Yui, Kanagawa (JP); Ken Nakata, Kanagawa (JP); Isao Makabe, Kanagawa (JP); Hiroyuki Ichikawa, Kanagawa (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 230 days.

(21) Appl. No.: 13/194,565

(22) Filed: Jul. 29, 2011

(65) Prior Publication Data

US 2012/0028447 A1 Feb. 2, 2012

(30) Foreign Application Priority Data

Jul. 30, 2010 (JP) .................................. 2010-171938

(51) Int. Cl.
*H01L 21/20* (2006.01)
*H01L 21/02* (2006.01)
*H01L 29/20* (2006.01)
*H01L 29/778* (2006.01)

(52) U.S. Cl.
CPC .... *H01L 21/02647* (2013.01); *H01L 21/02378* (2013.01); *H01L 21/02458* (2013.01); *H01L 21/02502* (2013.01); *H01L 21/0254* (2013.01); *H01L 21/0262* (2013.01); *H01L 29/2003* (2013.01); *H01L 29/7786* (2013.01)
USPC .................................... 438/478; 257/E21.098

(58) Field of Classification Search
CPC ................... H01L 21/02378; H01L 21/02458; H01L 21/02502; H01L 21/0254; H01L 21/0262; H01L 21/02647

USPC .................... 438/167, 478, 39; 257/E21.054, 257/E21.098
See application file for complete search history.

(56) References Cited

U.S. PATENT DOCUMENTS

| | | | | |
|---|---|---|---|---|
| 6,015,979 | A * | 1/2000 | Sugiura et al. | 257/86 |
| 6,121,121 | A * | 9/2000 | Koide | 438/481 |
| 6,342,748 | B1 * | 1/2002 | Nakamura et al. | 310/313 A |
| 6,468,347 | B1 * | 10/2002 | Motoki et al. | 117/89 |
| 7,319,064 | B2 * | 1/2008 | Lee et al. | 438/604 |
| 8,563,997 | B2 * | 10/2013 | Cheong | 257/97 |
| 2002/0066403 | A1 * | 6/2002 | Sunakawa et al. | 117/84 |
| 2003/0207518 | A1 * | 11/2003 | Kong et al. | 438/200 |

(Continued)

FOREIGN PATENT DOCUMENTS

| | | | |
|---|---|---|---|
| JP | 2008-166349 A | 7/2008 | |
| WO | WO2010/016532 A1 * | 2/2010 | H01L 33/00 |
| WO | WO 2010072273 A1 * | 7/2010 | H01L 21/205 |

OTHER PUBLICATIONS

Hinoki et al, "Correlation between resistivity and yellow luminescence intensity of GaN layers grown by MOCVD," 2006, Mater. Res. Sco. Symp. Proc. vol. 892, pp. 0892-FF23-14.1-0892-FF23-14.6.*

(Continued)

*Primary Examiner* — Joseph C Nicely
(74) *Attorney, Agent, or Firm* — Westerman, Hattori, Daniels & Adrian, LLP

(57) ABSTRACT

A method of manufacturing a semiconductor device includes growing a first GaN layer on a SiC substrate, and forming a second GaN layer on the first GaN layer, the second GaN layer being grown under such conditions that a ratio of a vertical growth rate to a horizontal growth rate is lower than that in the growth of the first GaN layer.

10 Claims, 6 Drawing Sheets

(56) References Cited

U.S. PATENT DOCUMENTS

| | | | |
|---|---|---|---|
| 2004/0016396 A1* | 1/2004 | Nagai et al. | 117/84 |
| 2004/0113166 A1* | 6/2004 | Tadatomo et al. | 257/98 |
| 2004/0123796 A1* | 7/2004 | Nagai et al. | 117/103 |
| 2005/0076830 A1* | 4/2005 | Motoki et al. | 117/92 |
| 2006/0084245 A1* | 4/2006 | Kohda | 438/478 |
| 2006/0194530 A1* | 8/2006 | Thomson et al. | 451/527 |
| 2006/0286782 A1* | 12/2006 | Gaska et al. | 438/483 |
| 2007/0217460 A1* | 9/2007 | Ishibashi et al. | 372/45.01 |
| 2007/0290228 A1* | 12/2007 | Yoshida | 257/190 |
| 2008/0185690 A1* | 8/2008 | Imer et al. | 257/622 |
| 2008/0202409 A1* | 8/2008 | Motoki et al. | 117/84 |
| 2008/0210949 A1 | 9/2008 | Makabe et al. | |
| 2008/0237610 A1* | 10/2008 | Imanishi et al. | 257/77 |
| 2008/0279242 A1* | 11/2008 | Bour | 372/45.011 |
| 2009/0057646 A1* | 3/2009 | Hirayama et al. | 257/13 |
| 2009/0079035 A1* | 3/2009 | Wang | 257/615 |
| 2009/0152565 A1* | 6/2009 | Brandes et al. | 257/76 |
| 2010/0129992 A1* | 5/2010 | Murata et al. | 438/478 |
| 2010/0171124 A1* | 7/2010 | Zheleva et al. | 257/76 |
| 2010/0207167 A1* | 8/2010 | Imanishi et al. | 257/201 |
| 2010/0275836 A1* | 11/2010 | Sato et al. | 117/97 |
| 2011/0108944 A1* | 5/2011 | Fujikura | 257/507 |
| 2011/0147763 A1* | 6/2011 | Hanawa et al. | 257/76 |
| 2011/0198590 A1* | 8/2011 | Preble et al. | 257/49 |
| 2011/0212559 A1* | 9/2011 | Ohmae et al. | 438/46 |
| 2011/0215424 A1* | 9/2011 | Sato | 257/409 |
| 2011/0309400 A1* | 12/2011 | Fukushima et al. | 257/98 |
| 2011/0316000 A1* | 12/2011 | Beaumont et al. | 257/76 |
| 2012/0025206 A1* | 2/2012 | Nakata et al. | 257/77 |
| 2012/0067275 A1* | 3/2012 | Imanishi et al. | 117/104 |
| 2012/0098102 A1* | 4/2012 | Imer et al. | 257/615 |
| 2012/0181547 A1* | 7/2012 | Flynn et al. | 257/76 |
| 2012/0187541 A1* | 7/2012 | Arena et al. | 257/615 |
| 2012/0248456 A1* | 10/2012 | Takano et al. | 257/76 |
| 2013/0207119 A1* | 8/2013 | Zheleva et al. | 257/76 |

OTHER PUBLICATIONS

Grieshaber et al., "Competition between band gap and yellow luminescence in GaN and its relevance for optoelectronic devices," 1996, J. App. Phys. 80 (8), 4615-4620.*

Kusakabe et al, "Overgrowth of GaN layer on GaN nano-columns by RF-molecular beam epitaxy," 2002, Journal of Crystal Growth, 237-239, pp. 988-992.*

* cited by examiner

PRIOR ART

METHOD OF MANUFACTURING SEMICONDUCTOR DEVICE

CROSS-REFERENCE TO RELATED APPLICATION

This application is based upon and claims the benefit of priority of the prior Japanese Patent Application No. 2010-171938 filed on Jul. 30, 2010, the entire contents of which are incorporated herein by reference.

BACKGROUND (i) Technical Field

A certain aspect of the embodiments discussed herein is related to a method of manufacturing a semiconductor device. Another aspect of the embodiments is related to a method of manufacturing a semiconductor device in which a GaN layer is grown on a SiC substrate.

(ii) Related Art

Semiconductor devices using a nitride semiconductor are used as power devices operating at high frequencies and at high powers. Particularly, FETs such as high electron mobility transistors (HEMTs) have been known as semiconductor devices suitable for amplification in a high-frequency band such as a microwave band, a quasi-millimeter band, or a millimeter band.

Semiconductor devices in which an AlN layer, an AlGaN layer, a GaN layer, and an electron supply layer are sequentially stacked on a Si substrate are known as semiconductor devices using a nitride semiconductor (see Japanese Patent Application Publication No. 2008-166349). It is also known that a SiC substrate, instead of a Si substrate, may be used as the substrate of a semiconductor substrate using a nitride semiconductor.

As shown in FIG. 1, there exist micropipes 12 in a SiC substrate 10. The micropipes 12 penetrate through the SiC substrate 10, and are several μm to several hundreds of μm in diameter. The micropipes 12 are orientated in various directions. In a case where a nitride semiconductor is grown on the SiC substrate 10, the micropipes 12 are not blocked and remain open in some cases. In such cases, semiconductor devices fail to achieve excellent characteristics at the portions where the micropipes 12 are left open.

SUMMARY

According to an aspect of the present invention, there is provided a method of manufacturing a semiconductor device, including: growing a first GaN layer on a SiC substrate; and forming a second GaN layer on the first GaN layer, the second GaN layer being grown under such conditions that a ratio of a vertical growth rate to a horizontal growth rate is lower than that in the growth of the first GaN layer.

DETAILED DESCRIPTION

The following is a description of embodiments of the present invention, with reference to the accompanying drawings.

First Embodiment

Figure 1:
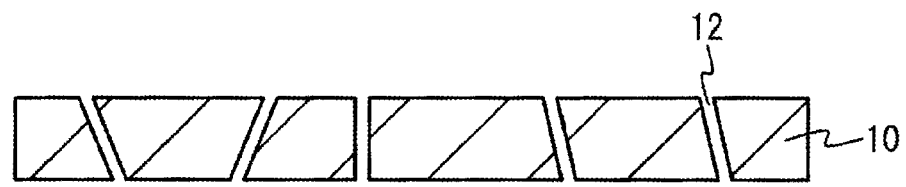
FIG. 1 is an exemplary cross-sectional view of a SiC substrate for explaining micropipes.
Figure 2A:
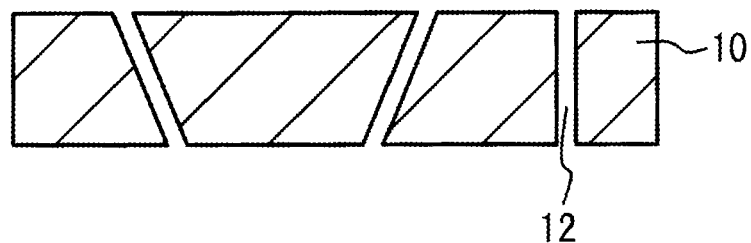
FIGS. 2A through 2C are first through third exemplary schematic cross-sectional views illustrating a method of manufacturing a semiconductor device according to a first embodiment.

FIGS. 2A through 3B are exemplary schematic cross-sectional views for explaining a method of manufacturing a semiconductor device according to the first embodiment. The first embodiment concerns an example case of an epi-layer forming a HEMT of a nitride semiconductor. It should be noted that a nitride semiconductor is a semiconductor containing nitrogen, and may be GaN, InN, AlN, AlGaN, InGaN, or AlInGaN, for example. As shown in FIG. 2A, a SiC substrate 10 is first prepared. In the SiC substrate 10, there exist micropipes 12 penetrating through the SiC substrate 10. In some cases, the polishing agent, the polishing waste, or the like, which has been used or generated when the surface of the SiC substrate 10 is polished, remains in the micropipes 12. FIG. 4 is an exemplary cross-sectional view showing a situation where residues 14 such as the polishing agent or polishing waste remain in a micropipe 12. To remove the residues 14 in the micropipe 12, suitable organic ultrasonic cleaning such as IPA (isopropyl alcohol) ultrasound cleaning, ethanol ultrasonic cleaning, ultrapure water ultrasonic cleaning is performed on the SiC substrate 10. Through the ultrasonic cleaning, the residues 14 in the micropipe 12 can be removed.

Figure 2B:
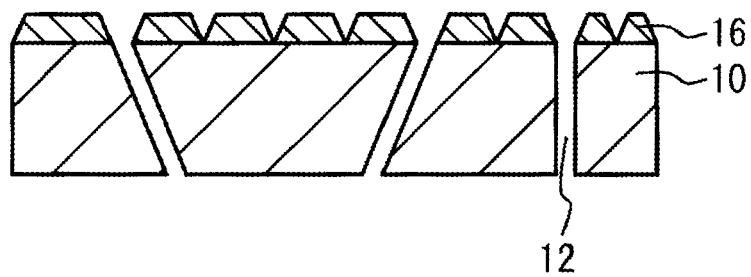

As shown in FIG. 2B, an AlN layer 16 is grown on the SiC substrate 10 by MOCVD (metalorganic chemical vapor deposition), for example. In the growth of the AlN layer 16, the growth temperature is 1080° C., the pressure is 13.3 kPa, and TMA (trimethylaluminum) and $NH_3$ (ammonia) are used as sources. The thickness of the AlN layer 16 is 10 nm, for example. The thickness of the AlN layer 16 is made small, so that the AlN layer 16 formed on the SiC substrate 10 has island-like portions. That is, the upper face of the AlN layer 16 has concavities and convexities.

Figure 2C:
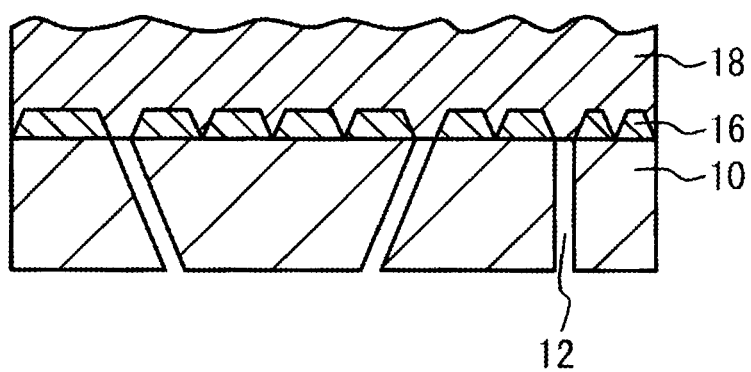

As shown in FIG. 2C, a first GaN layer 18 is grown on the AlN layer 16 by MOCVD, for example. In the growth of the first GaN layer 18, the growth temperature is 1080° C., the pressure is 6.7 kPa, the growth rate is 0.2 nm/sec, TMG (trimethylgallium) and $NH_3$ are used as sources, the flow rate of the TMG is 90 μmol/min, and the flow rate of the $NH_3$ is 0.9 mol/min. The thickness of the first GaN layer 18 is 200 nm, for example. Under the growth conditions involving a low pressure, the growth of the first GaN layer 18 can be made relatively large in the horizontal direction (horizontal growth), and the micropipes 12 can be blocked. As the micropipes 12 can be blocked, the SiC substrate 10 having the micropipes 12 can be effectively used. In the horizontal growth, the ratio of the horizontal growth rate to the vertical growth rate, or the horizontal to vertical ratio, is preferably 0.4 or higher. More preferably, the horizontal to vertical ratio is 1.5 or higher. Since the first GaN layer 18 is grown in the horizontal direction, concavities and convexities are formed in the upper face of the first GaN layer 18.

Figure 3A:
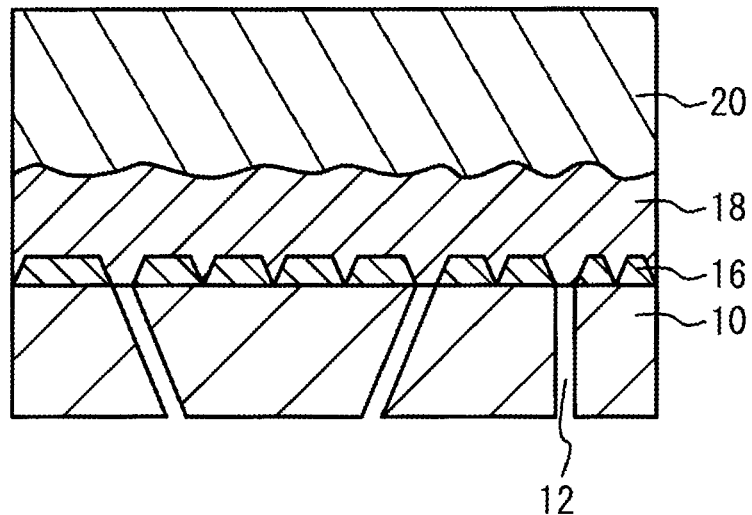
FIGS. 3A and 3B are fourth and fifth exemplary schematic cross-sectional views illustrating the method of manufacturing a semiconductor device according to the first embodiment.
Figure 4:
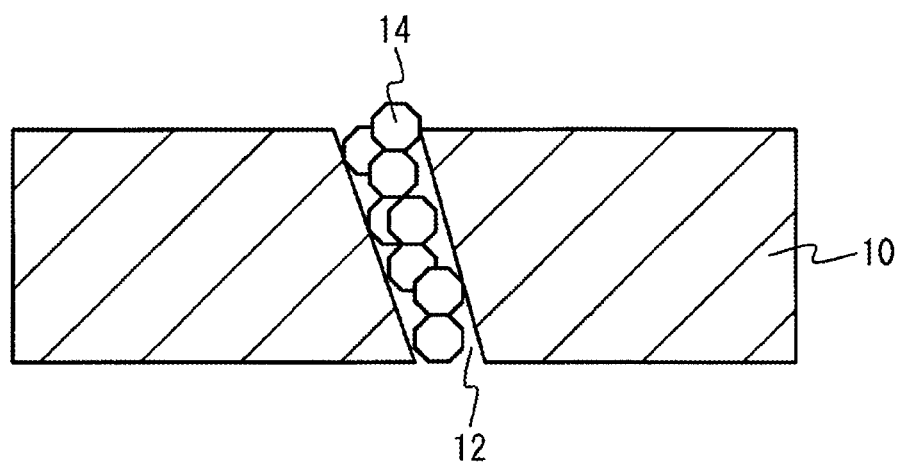
FIG. 4 is an exemplary schematic cross-sectional view showing a situation where residues remain in a micropipe.

As shown in FIG. 3A, a second GaN layer 20 is grown on the first GaN layer 18 by MOCVD, for example. In the growth of the second GaN layer 20, the growth temperature is 1080° C., the pressure is 13.3 kPa, the growth rate is 0.3 nm/sec, TMG and NH$_3$ are used as sources, the flow rate of the TMG is 90 μmol/min, and the flow rate of the NH$_3$ is 0.9 mol/min. The thickness of the second GaN layer 20 is 800 nm, for example. Under such growth conditions, the second GaN layer 20 can be grown at a higher vertical growth rate than the vertical growth rate of the first GaN layer 18 (in this specification, this growth is referred to as the vertical growth). In this vertical growth, the ratio of the horizontal growth rate to the vertical growth rate, or the horizontal to vertical ratio, is preferably lower than 0.4. More preferably, the horizontal to vertical ratio is 0.3 or lower. The above described growth conditions are such growth conditions that the intensity of light emitted in a broad band of 500 to 700 nm (Yellow Band: YB) according to a photoluminescence evaluation can be reduced. Since there is a correlation between the intensity of yellow band emission and current collapses, current collapses can be restrained by lowering the intensity of yellow band emission. As the second GaN layer 20 is grown in the vertical direction, the upper face of the second GaN layer 20 is flatter than the upper face of the first GaN layer 18.

Figure 3B:
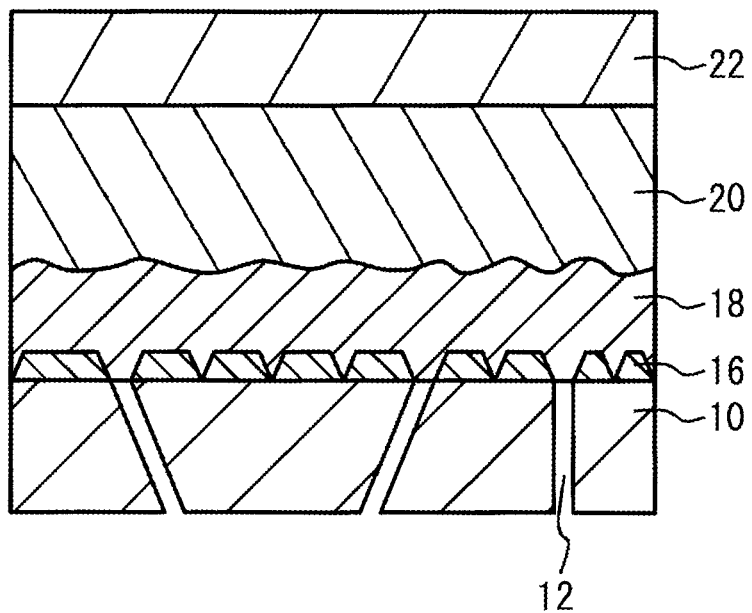

As shown in FIG. 3B, an AlGaN electron supply layer 22 is grown on the second GaN layer 20 by MOCVD, for example. In the growth of the AlGaN electron supply layer 22, the growth temperature is 1080° C., the pressure is 13.3 kPa, and TMA, TMG, and NH$_3$ are used as sources. The thickness of the AlGaN electron supply layer 22 is 20 nm, for example. A 2DEG (two-dimensional electron gas) is generated in the interface between the second GaN layer 20 and the AlGaN electron supply layer 22, and as a result, a channel layer is formed.

To prove that the micropipes 12 can be blocked by using the method of manufacturing a semiconductor device according to the first embodiment, a semiconductor device having a GaN layer grown under different growth conditions from those of the first embodiment was prepared according to Comparative Example 1.

Figure 5A:
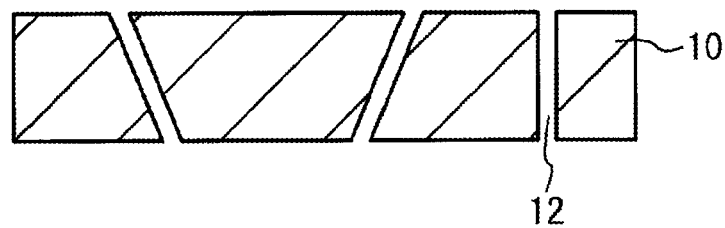
FIGS. 5A through 5D are exemplary schematic cross-sectional views illustrating a method of manufacturing a semiconductor device according to Comparative Example 1.

Referring now to FIGS. 5A through 5D, a method of manufacturing a semiconductor device according to Comparative Example 1 is described. FIGS. 5A through 5D are exemplary schematic cross-sectional views illustrating the method of manufacturing a semiconductor device according to Comparative Example 1. As shown in FIG. 5A, the SiC substrate 10 is cleaned by the same cleaning technique as that illustrated in FIG. 2A, and the residues 14 in the micropipes 12 are removed.

Figure 5B:
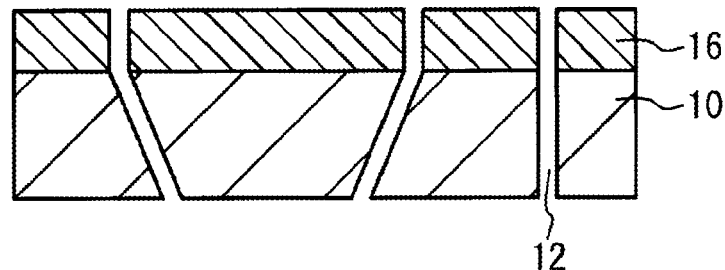

As shown in FIG. 5B, the AlN layer 16 is grown on the SiC substrate 10 by MOCVD, for example. In the growth of the AlN layer 16, the growth temperature is 1080° C., the pressure is 13.3 kPa, and TMA and NH$_3$ are used as sources. The thickness of the AlN layer 16 is made greater than 50 nm, for example. The AlN layer 16 is made to have such a thickness that the AlN layer 16 does not have island-like portions. Accordingly, the flatness of the upper face of the AlN layer 16 can be improved.

Figure 5C:
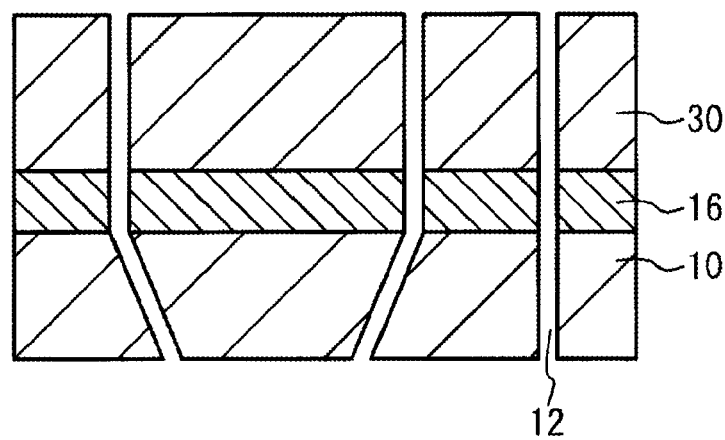

As shown in FIG. 5C, a GaN layer 30 is grown on the AlN layer 16 by MOCVD, for example. In the growth of the GaN layer 30, the growth temperature is 1080° C., the pressure is 13.3 kPa, the growth rate is 0.3 nm/sec, TMG and NH$_3$ are used as sources, the flow rate of the TMG is 90 μmol/min, and the flow rate of the NH$_3$ is 0.9 mol/min. The thickness of the GaN layer 30 is 1000 nm, for example. Under such growth conditions, the YB intensity in the wavelength range of 500 to 700 nm can be reduced. As a result, current collapses can be restrained. Also, the GaN layer 30 grows in the vertical direction. Since the GaN layer 30 grows in the vertical direction, the flatness of the upper face of the GaN layer 30 is high.

Figure 5D:
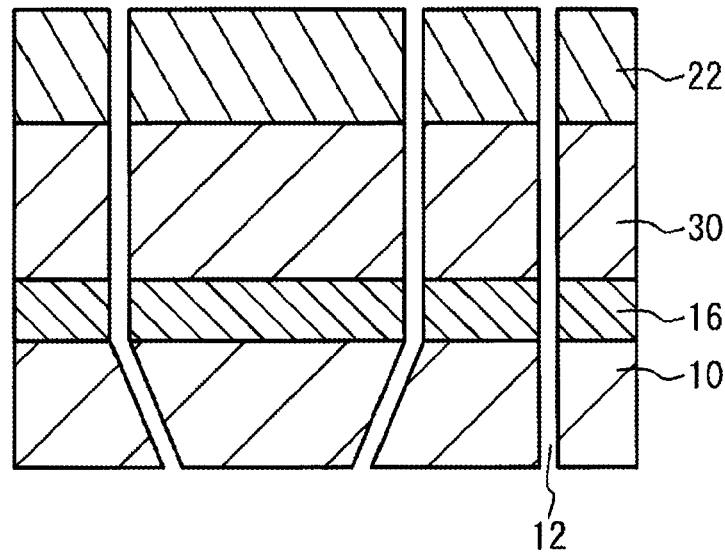

As shown in FIG. 5D, the AlGaN electron supply layer 22 is grown on the GaN layer 30 by MOCVD, for example. In the growth of the AlGaN electron supply layer 22, the growth temperature is 1080° C., the pressure is 13.3 kPa, and TMA, TMG, and NH$_3$ are used as sources. The thickness of the AlGaN electron supply layer 22 is 20 nm, for example. A 2DEG (two-dimensional electron gas) is generated in the interface between the GaN layer 30 and the AlGaN electron supply layer 22, and as a result, a channel layer is formed. A source electrode, a drain electrode, and a gate electrode are then formed on the AlGaN electron supply layer 22. Through the above procedures, the semiconductor device according to Comparative Example 1 is completed.

Table 1 shows the results of counting of the numbers of micropipes 12 observed after the SiC substrate 10 was cleaned as illustrated in FIG. 2A and FIG. 5A, and the numbers of micropipes 12 that were not blocked after the second GaN layer 20 and the GaN layer 30 were grown as illustrated in FIG. 3A and FIG. 5C. After surface-shape images were obtained with a laser surface analysis apparatus, the numbers of the micropipes 12 were counted by performing image analyses to measure the sizes of the micropipes 12 and count the numbers of the micropipes 12.

TABLE 1

| | Size (diameter) of micropipe | | |
|---|---|---|---|
| | 2 μm or smaller | 2 μm~ 5 μm | 5 μm or larger |
| Number of micropipes after cleaning | 100 | 30 | 3 |
| Number of micropipes after growth in comparative example 1 | 10 | 20 | 3 |
| Number of micropipes after growth in first embodiment | 0 | 0 | 0 |

As shown in Table 1, after the cleaning of the SiC substrate 10 in both the first embodiment and Comparative Example 1, the number of micropipes 12 having diameters of 2 μm or smaller was approximately 100, the number of micropipes 12 having diameters of 2 to 5 μm was approximately 30, and the number of micropipes 12 having diameters of 5 μm or larger was approximately 3. In Comparative Example 1, after the growth of the GaN layer 30, the number of non-blocked micropipes 12 having diameters of 2 μm or smaller was approximately 10, the number of non-blocked micropipes 12 having diameters of 2 to 5 μm was approximately 20, and the number of non-blocked micropipes 12 having diameters of 5 μm or larger was approximately 3. As can be seen from the results, by the method of manufacturing the semiconductor device according to Comparative Example 1, a certain number of micropipes 12 having small diameters can be blocked, but micropipes 12 having large diameters (larger than 2 μm, for example) cannot be blocked.

By the method of manufacturing the semiconductor device according to the first embodiment, on the other hand, after the second GaN layer 20 was grown, all the micropipes 12 were successfully blocked, regardless of the diameters.

As described so far, according to the first embodiment, the first GaN layer 18 is grown on the SiC substrate 10, and the second GaN layer 20 is formed on the first GaN layer 18 under the condition that the ratio of the horizontal growth rate to the vertical growth rate is lower than that for the first GaN layer 18. Since the first GaN layer 18 is first grown on the SiC substrate 10 through a horizontal growth in this manner, the micropipes 12 can be blocked as shown in Table 1. Accordingly, even where the SiC substrate 10 having micropipes 12 existing therein is used in a semiconductor device manufacturing process, a semiconductor device with excellent characteristics can be obtained. Also, by growing the second GaN layer 20 on the first GaN layer 18 through a vertical growth, the intensity of yellow band emission can be lowered. As described above, according to the first embodiment, the micropipes 12 can be blocked, and the intensity of yellow band emission can be lowered.

For example, in a case where the horizontally-grown first GaN layer 18 is made thicker while the second GaN layer 20 is not formed, the pressure is lowered in the horizontal growth, and therefore, the intensity of yellow band emission becomes higher. In the first embodiment, on the other hand, the vertically-grown second GaN layer 20 is formed on the first GaN layer 18, and as a result, the intensity of yellow band emission of the vertically-grown second GaN layer 20 becomes lower than that of the first GaN layer 18. Accordingly, the intensity of yellow band emission can be lowered.

As shown in FIG. 2C, the first GaN layer 18 is preferably formed on the island-like AlN layer 16 through a horizontal growth, after the thin AlN layer 16 is grown on the SiC substrate 10 to form the AlN layer 16 having island-like portions. In this manner, the micropipes 12 can be more certainly blocked.

In the above described example case, the thickness of the AlN layer 16 is 10 nm. However, the thickness of the AlN layer 16 is not limited to that, as long as the AlN layer 16 can have island-like portions. For example, the thickness of the AlN layer 16 is preferably 50 nm or smaller, or more preferably, 10 nm or smaller. Such a thickness of the AlN layer 16 can be calculated from the growth rate at which the AlN layer 16 is grown, for example.

Also, as illustrated in FIG. 2A, the SiC substrate 10 is cleaned to remove the residues 14 in the micropipes 12. After the cleaning procedure is carried out, the procedure for forming the first GaN layer 18 on the SiC substrate 10 through a horizontal growth is carried out, as illustrated in FIG. 2C. In this manner, the micropipes 12 can be more certainly blocked.

As illustrated in FIG. 2C and FIG. 3A, the first GaN layer 18 is grown in the horizontal direction, and therefore, the upper face of the first GaN layer 18 have concavities and convexities. The second GaN layer 20 is grown in the vertical direction, and therefore, the upper face of the second GaN layer 20 is flatter than the upper face of the first GaN layer 18.

In the first embodiment, the growth conditions for forming the first GaN layer 18 are instantly changed to the growth conditions for forming the second GaN layer 20, but the present invention is not limited to that. The growth conditions for forming the first GaN layer 18 may be gradually changed to the growth conditions for forming the second GaN layer 20.

Under the growth conditions for forming the first GaN layer 18 in the above described example case, the growth temperature is 1080° C., the pressure is 6.7 kPa, the growth rate is 0.2 nm/sec, the flow rate of TMG is 90 μmol/min, and the flow rate of NH$_3$ is 0.9 mol/min. However, growth conditions that can be used are not limited to those growth conditions. Some other conditions may be used, as long as the first GaN layer 18 can be grown in the horizontal direction. In the horizontal growth, the ratio of the horizontal growth rate to the vertical growth rate is preferably 0.4 or higher, and more preferably, 1.5 or higher. For example, a certain horizontal growth can be achieved under growth conditions that allow a higher growth temperature, a lower growth rate, and a higher V/III ratio so as to lower the intensity of yellow band emission.

However, to further accelerate the horizontal growth, the pressure is preferably lower than 26.7 kPa, or more preferably, 13.3 kPa or lower, or even more preferably, 6.7 kPa or lower.

Under the growth conditions for forming the second GaN layer 20 in the above described example case, the growth temperature is 1080° C., the pressure is 13.3 kPa, the growth rate is 0.3 nm/sec, the flow rate of TMG is 90 μmol/min, and the flow rate of NH$_3$ is 0.9 mol/min. However, growth conditions that can be used are not limited to those growth conditions. Some other conditions may be used, as long as the second GaN layer 20 can be grown in the vertical direction, and the intensity of yellow band emission can be made lower. In the vertical growth, the ratio of the horizontal growth rate to the vertical growth rate is preferably lower than 0.4, and more preferably, 0.3 or lower. For example, under preferred growth conditions, the growth rate is 1.0 μm/hour, the temperature is 1050° C. or higher, the V/III ratio is 5000 or higher, and the pressure is 26.7 kPa or higher.

In the above described example case, the thickness of the first GaN layer 18 is 200 nm. However, the thickness of the first GaN layer 18 is not limited to that, and the first GaN layer 18 can have any thickness, as long as the micropipes 12 can be blocked, and the intensity of yellow band emission can be lowered. For example, the thickness of the first GaN layer 18 is preferably 10 nm or greater but not greater than 1000 nm, or more preferably, 20 nm or greater but not greater than 500 nm, or even more preferably, 50 nm or greater but not greater than 300 nm.

Second Embodiment

Figure 6:
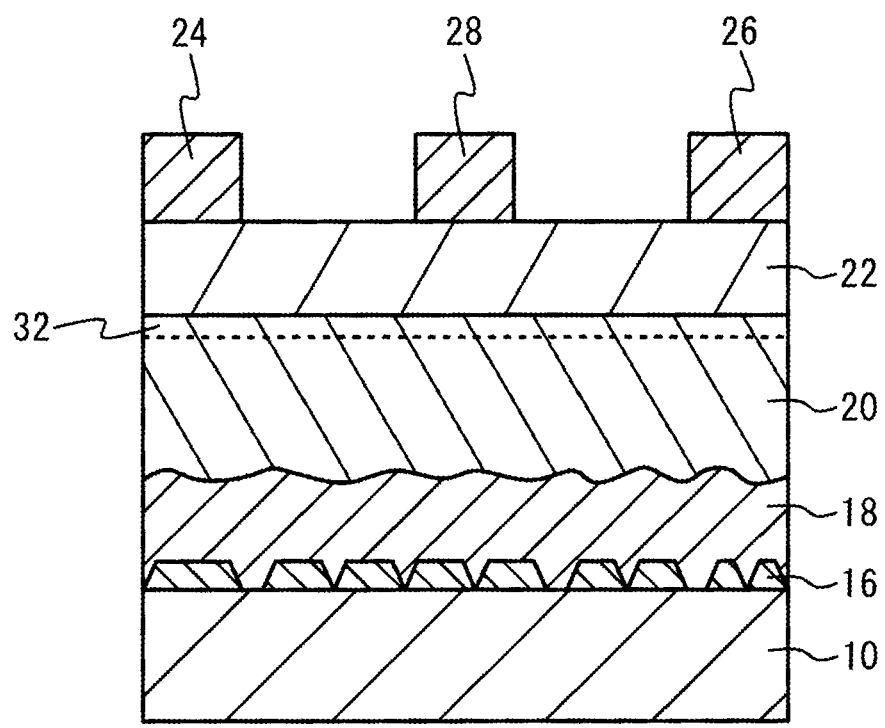
FIG. 6 is an exemplary schematic cross-sectional view of a semiconductor device according to a second embodiment.

A second embodiment is an exemplary semiconductor device using the epi-layer manufactured by the method of manufacturing the semiconductor device according to the first embodiment. FIG. 6 is an exemplary schematic cross-sectional view of a semiconductor device according to the second embodiment. As shown in FIG. 6, the AlN layer 16, the first GaN layer 18, the second GaN layer 20, and the AlGaN electron supply layer 22 are sequentially stacked on the SiC substrate 10 by the manufacturing method of the first embodiment illustrated in FIGS. 2A through 3B. A 2DEG (two-dimensional electron gas) is generated in the interface between the second GaN layer 20 and the AlGaN electron supply layer 22, and a channel layer 32 is formed. A source electrode 24 and a drain electrode 26 that are to serve as ohmic electrodes are formed on the AlGaN electron supply layer 22 by stacking Ti (titanium) and Au (gold) in this order when seen from the AlGaN electron supply layer 22. A gate electrode 28 that is to serve as a Schottky electrode is formed on a portion of the AlGaN electron supply layer 22 located between the source electrode 24 and the drain electrode 26, by stacking Ni and Au in this order when seen from the AlGaN electron supply layer 22. After Ti and Au are deposited by a vapor deposition technique, the deposited Ti and Au are held at 700° C. for five minutes, for example. In this manner, the Ti and Au are alloyed, and the source electrode 24 and the drain electrode 26 are turned into ohmic electrodes. The gate electrode 28 is formed by depositing Ni and Au by a vapor deposition technique.

In the semiconductor device according to the second embodiment, the micropipes 12 are blocked, and accordingly, excellent characteristics can be achieved.

In the above described example cases of the first and second embodiments, HEMTs are used. However, those embodiments may not be limited to HEMTs, but transistors other than HEMTs may be used, as long as a GaN layer can be grown on a SiC substrate.

The present invention is not limited to the specifically described embodiments, but includes other embodiments and variations within the scope of the claimed invention.

What is claimed is:

1. A method of manufacturing a semiconductor device, comprising:
    growing an AlN layer on a SiC substrate so that an upper face of the AlN layer having concavities and convexities;
    growing a first GaN layer on the concavities and convexities in the upper face of the AlN layer formed on the SiC substrate so that concavities and convexities are formed in an upper face of the first GaN layer; and
    growing a second GaN layer so that the grown second layer directly touches the concavities and convexities in the upper face of the first GaN layer under a condition in which X2 that is a ratio H/V for the second GaN layer is lower than X1 that is the ratio H/V for the first GaN layer, when a vertical growth rate is V and a horizontal growth rate is H,
    wherein a pressure in a growth of the first GaN layer is lower than a pressure in a growth of the second GaN layer.

2. The method according to claim 1, wherein intensity of yellow band emission of the second GaN layer is lower than that of the first GaN layer.

3. The method according to claim 1, wherein an upper face of the second GaN layer is flatter than the upper face of the first GaN layer.

4. The method according to claim 1, wherein the forming the first GaN layer includes forming the first GaN layer having a thickness of 10 to 1000 nm.

5. The method according to claim 1, wherein the X1 that is the ratio H/V in the growth of the first GaN layer is 0.4 or higher.

6. The method according to claim 1, wherein the X1 that is the ratio H/V in the growth of the first GaN layer is 1.5 or higher.

7. The method according to claim 1, wherein the X2 that is the ratio H/V in the growth of the second GaN layer is lower than 0.4.

8. The method according to claim 1, wherein the X2 that is the ratio H/V in the growth of the second GaN layer is 0.3 or lower.

9. The method according to claim 1, wherein the AlN layer has a thickness of 50 nm or smaller.

10. The method according to claim 1, wherein the AlN layer has a thickness of 10 nm or smaller.

* * * * *